(12) United States Patent
Okamoto

(10) Patent No.: US 6,522,157 B2
(45) Date of Patent: Feb. 18, 2003

(54) MECHANISM FOR CONNECTING TEST HEAD TO HANDLER

(75) Inventor: Kazumi Okamoto, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/791,664

(22) Filed: Feb. 26, 2001

(65) Prior Publication Data

US 2002/0060581 A1 May 23, 2002

(30) Foreign Application Priority Data

Feb. 29, 2000 (JP) ........................................ 2000-054014

(51) Int. Cl.⁷ ............................................... G01R 31/02
(52) U.S. Cl. ..................................... 324/760; 324/158.1
(58) Field of Search ................................. 324/760, 765, 324/158.1, 755; 165/61, 80.4, 104.34, 117

(56) References Cited

U.S. PATENT DOCUMENTS

| | | | | |
|---|---|---|---|---|
| 3,710,251 A | * | 1/1973 | Hagge et al. | ............... 324/760 |
| 4,757,255 A | * | 7/1988 | Margozzi | ..................... 324/758 |
| 4,870,355 A | * | 9/1989 | Kufis et al. | ................. 324/760 |
| 5,461,327 A | * | 10/1995 | Shibata et al. | ........... 324/158.1 |
| 5,917,329 A | * | 6/1999 | Cadwallader et al. | ....... 324/754 |
| 6,313,653 B1 | * | 11/2001 | Takahashi et al. | .......... 324/760 |

* cited by examiner

*Primary Examiner*—Michael Sherry
*Assistant Examiner*—Minh N. Tang
(74) *Attorney, Agent, or Firm*—Oliff & Berridge, PLC

(57) ABSTRACT

An IC under test can be tested in a suitable temperature environment merely by connecting a test head to an automatic handler, without complicated operations. The automatic handler is connected to the test head through a piping portion in the automatic hander and a piping portion in the test head. The automatic hander has a dry air supply unit which keeps a testing environment of the IC under test by supplying dry air to the test head through the piping portions. The automatic handler has a lead hole, while the test head has a connection hole leading to the lead hole when the automatic handler and the test head are connected to each other.

12 Claims, 4 Drawing Sheets

MECHANISM FOR CONNECTING TEST HEAD TO HANDLER

BACKGROUND OF THE INVENTION

1. Field of the Invention

The present invention relates to a connecting mechanism for connecting a test head which tests an integrated circuit (hereinafter, it may be simply referred to "IC") to an automatic handler sorting the IC according to a result of the test by the test head, particularly, to a connecting mechanism for connecting a test head to an automatic handler having a low temperature testing function.

2. Description of Related Art

As an automatic handler which is connected to an IC tester, the one that cools IC under test and tests electric characteristics of the IC under test in a low temperature environment has been known. In other words, an automatic handler having a low temperature testing function has been known. Hereinafter, such automatic handler may be simply referred to "low temperature handler". The low temperature handler has a dry air supply unit which supplies dry air to a testing portion (for example, a testing box in a thermostat) in order to prevent a frost formation in the testing portion when the low temperature handler tests the IC under test in the low temperature environment.

FIGS. 3, 4A and 4B show an example of an IC test system including the low temperature handler, according to an earlier technology. FIG. 4A shows that the low temperature handler and a test head are separated from each other. FIG. 4B shows that the low temperature handler is connected to the test head.

The IC test system 1 has, as shown in FIGS. 3, 4A and 4B, the test head 2 and the low temperature handler 3. The test head 2 is provided with a testing box 21 on which a contact board 24 is disposed. The contact board 24 has IC sockets 23. Coupling cables 28 are connected to the contact board 24 through connectors 25, and also connected to a test head body 20 through a base board 29 with being surrounded closely by packing 29a for a cable outlet or exit, as shown in a central ruptured portion of FIG. 3. The testing box 21 is provided with an air intake 26 for frost formation prevention for letting dry air from a dry air supply unit in the testing box 21 through a piping hose 27. The low temperature handler 3 has a thermostat 31, a transfer carrier 32, a contact pusher 33 and a piping hose 35 (see FIGS. 4A and 4B) which is connected to the dry air supply unit (not shown).

When ICs are tested with the IC test system 1, the test head 2 is moved to the low temperature handler 3. Then the testing box 21 is inserted in the thermostat 31, inside of which is kept the low temperature environment, thereby the test head 2 is connected to the low temperature handler 3, as shown in FIG. 4B. Leads of the ICs under test transferred by the transfer carrier 32 are pressed against contacts of the IC sockets 23 by the contact pusher 33 to be brought into contact with the contacts. Thus, electric characteristics of the ICs in the low temperature environment are tested. At this time, the piping hose 27 and the piping hose 35 are connected to each other through junction connectors 37 at outside of the low temperature handler 3 and the test head 2. The dry air is supplied to the testing box 21 from the dry air supply unit through the connected piping hoses 27 and 35, suppressing entering of moisture of outside air from spaces between the coupling cables 28 and the packing 29a to the testing box 21 during the IC test. Thereby, the frost formation in the testing box 21 is prevented.

With the IC test system 1, aside from a connection between the test head 2 and the low temperature handler 3, the piping hose 27 of the testing box 21 is connected to the piping hose 35 of the low temperature handler 3 through the junction connectors 37. Thus, when the test head 2 and the low temperature handler 3 are connected to or separated from each other, in addition to the connection or separation of them, the connection or separation of the piping hoses 27 and 35 is required, taking a lot of time. Furthermore, a person may forget the connection between the piping hoses 27 and 35 when the test head 2 and the low temperature handler 3 are connected to each other.

When the test head 2 is separated from the low temperature handler 3, if the piping hoses 27 and 35 are left connected, the piping hose 27 of the test head 2 pulls the piping hose 35 of the low temperature handler 3. Thus, the piping hoses 27 and 35 may become wrong or be damaged. Furthermore, during the transfer of the test head 2, a person should pay attention to the piping hose 27 which is connected to the testing box 21. Thus, the operations for them are complicated.

SUMMARY OF THE INVENTION

The present invention was developed in view of the above-described problems. Therefore, an object of the present invention is to provide a mechanism for connecting a test head to an automatic handler, that makes an IC test system capable of testing an IC under test in a suitable temperature environment not by complicated operations but merely by connecting the test head to the automatic handler.

In order to accomplish the above-described object, in one aspect of the present invention, a mechanism for connecting a test head to an automatic handler comprises a piping for connecting the test head to the automatic handler, and a fluid supply means for supplying fluid in the test head through the piping and for keeping a testing environment for an IC under test. The fluid may be for preventing a frost formation. The piping comprises a first piping portion which is provided to the automatic handler and which has a first piping connection opening. The piping also comprises a second piping portion which is provided to the test head and connected to the first piping portion. The second piping portion has a second piping connection opening which is connected to the first piping connection opening when test head is connected to the automatic handler.

The fluid may comprise whatever that is supplied to the test head for keeping the testing environment the desired one and prevents the frost formation when the IC under test is tested. For example, dry air may be used for preventing outside air from entering the test head and preventing the frost formation to be generated.

According to the mechanism, the piping connection openings are connected to each other at the same time that the test head and the automatic handler are connected to each other, so that the first piping portion and the second piping portion are connected to each other.

Thus, the fluid which prevents the frost formation, for example, compressed fluid, is supplied to the test head from the fluid supply means, merely by connecting the test head to the automatic handler, so that the electric characteristics of the IC under test can be tested by the test head with the predetermined testing environment kept.

That is, except the connection between the test head and the automatic handler, the operations of connection between the test head and the fluid supply means for supplying the fluid to the test head, such as the connection of piping hoses, are not required. Accordingly, forgetting of the connection between the piping of the fluid supply means of the automatic handler and the piping of the test head, or the interference by each piping hoses when the automatic handler and the test head are separated from each other, as in the earlier technology, is solved. Particularly, during the separation of the test head from the automatic handler or the transfer of the test head for connecting it to the automatic handler, the interference by the piping hoses is reduced. Thus, the automatic handler and the test head can be smoothly connected to each other. Furthermore, when the test head is separated from the automatic handler, the piping may not become wrong or be damaged by forgetting the operations for the separation of the piping for supplying fluid to the test head, differing from the earlier technology.

The automatic handler may comprise a thermostat. The test head may comprise a testing box which is inserted in the thermostat. The testing box may be provided with an IC socket which is brought into electrical contact with the IC under test. When the testing box is inserted in the thermostat, the first piping connection opening of the automatic handler and the second piping connection opening of the test head may be connected to each other in a contacting portion between the thermostat and the testing box.

According to the mechanism, the first piping connection opening of the automatic handler and the second piping connection opening of the test head may be connected to each other in the contacting portion. Thus, when the testing box having the IC socket is inserted in the thermostat, the fluid supply means and the test head may be connected to each other through the first and second piping portions. Therefore, the advantage described above may be obtained.

The fluid which is supplied to the test head from the fluid supply means may comprise dry air.

According to the mechanism, when the electric characteristics of the IC under test are tested by the test head, merely by connecting the test head to the automatic handler, the dry air from the fluid supply means may be supplied to the test head, preventing the outside air from entering the test head to prevent the frost formation. Thus, the electric characteristics of the IC under test may be tested in the suitable low temperature environment.

The automatic handler may be a horizontally conveyer type and have a function for keeping a low temperature, and the frost formation in the test head connected to the automatic handler may be prevented.

According to the mechanism, the frost formation in the test head may be prevented merely by connecting the test head to the automatic handler, which may be the horizontally conveyer type having the low temperature keep function.

BRIEF DESCRIPTION OF THE DRAWINGS

The above and other objects, features and advantages of the invention will become more apparent from the following description taken in conjunction with the accompanying drawings wherein like references refer to like parts and wherein:

FIGS. 2A and 2B show the connecting mechanism for connecting the test head to the automatic handler of FIG. 1, wherein FIG. 2A is a vertical section in which a contact portion between the test head and the automatic handler is partially interrupted, and FIG. 2B is a plan view of an edge portion of a base board;

PREFERRED EMBODIMENT OF THE INVENTION

Hereinafter, a mechanism for connecting a test head to a low temperature handler according to an embodiment of the present invention will be explained, referring to FIGS. 1, 2A and 2B.

Figure 1:
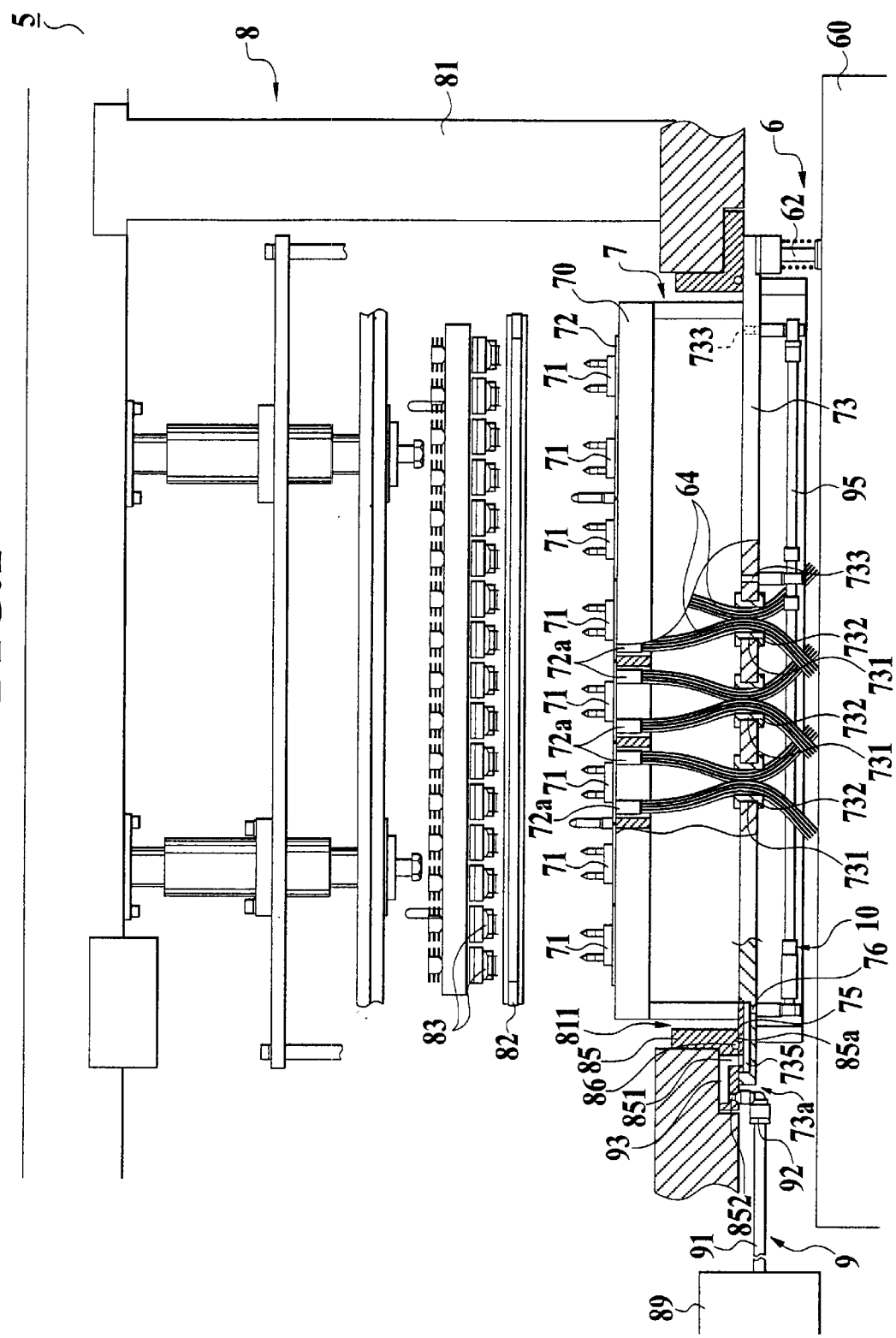
FIG. 1 is a partially interrupted vertical section of a connecting mechanism for connecting a test head to an automatic handler according to an embodiment of the present invention.

FIG. 1 shows an IC test system 5 to which the present invention is adapted. The IC test system 5 has a test head 6 and an automatic handler 8 which is connected to the test head 6 that tests the electric characteristics of ICs under test. The automatic handler 8 of the IC test system 5 in this embodiment can cool the ICs under test and test the electric characteristics of the ICs under test in the low temperature environment.

The test head 6 is provided with a test head body 60 which is attached movably up and down to a supporting leg which is movable and not shown. The test head 6 is connected to a tester body through a cable, which is not shown. The tester body has a main control circuit, a power supply or the like in the tester body. The test head 6 may be suitably exchanged to another one according to types of semiconductor ICs to be tested, the number thereof or the like.

The test head body 60 has a testing box 7 which is attached thereto through a fixing hardware 62.

The testing box 7 is inserted in a thermostat 81. The testing box 7 is provided with a box body portion 70 on which a contact board 72 is mounted, and a box base board portion 73 located on a bottom of the box body portion 70. On an upper surface, the contact board 72 has IC sockets 71 which are electrically connected to the ICs under test.

On a lower surface of the contact board 72 and in the testing box body portion 70, connectors 72a are disposed. The connectors 72a are connected to one end of each coupling cables 64.

The coupling cables 64 are passed through opening portions 731 of the box base board portion 73 as a bottom board of the testing box 7. The other ends of each coupling cables 64 are connected to the test head body 60. The test head body 60 is connected to the tester body, which is not shown, through a cable.

Packing 732 are disposed along peripheries of the opening portions 731, improving airtightness between the coupling cables 64 and opening portions 731.

The base board portion 73 is provided with a plurality of vent holes 733 connected to a box lower piping portion 95 disposed under the base board portion 73.

The box lower piping portion 95 leads dry air which is supplied from a dry air supply unit (a gas supply unit) 89 to the testing box 7.

The box lower piping portion 95, along with the opening portions 731, a grooved portion 735, a hole portion 76 and a connection hole (a second piping connection opening at a side of the test head) 77 described in a later, constitute a test head piping portion (a second piping portion) 10.

An edge portion 73a (a contacting portion) of the base board portion 73 projects to an outside of the box body portion 70 from a side thereof. When the box body portion 70 of the testing box 7 is inserted in the thermostat 81, the edge portion 73a is brought into contact with a side wall lower end portion, described later, of the thermostat 81, that is, with a lower surface (a contacting portion) 85a of a contact block 85 to shut the thermostat 81.

Figure 2A:
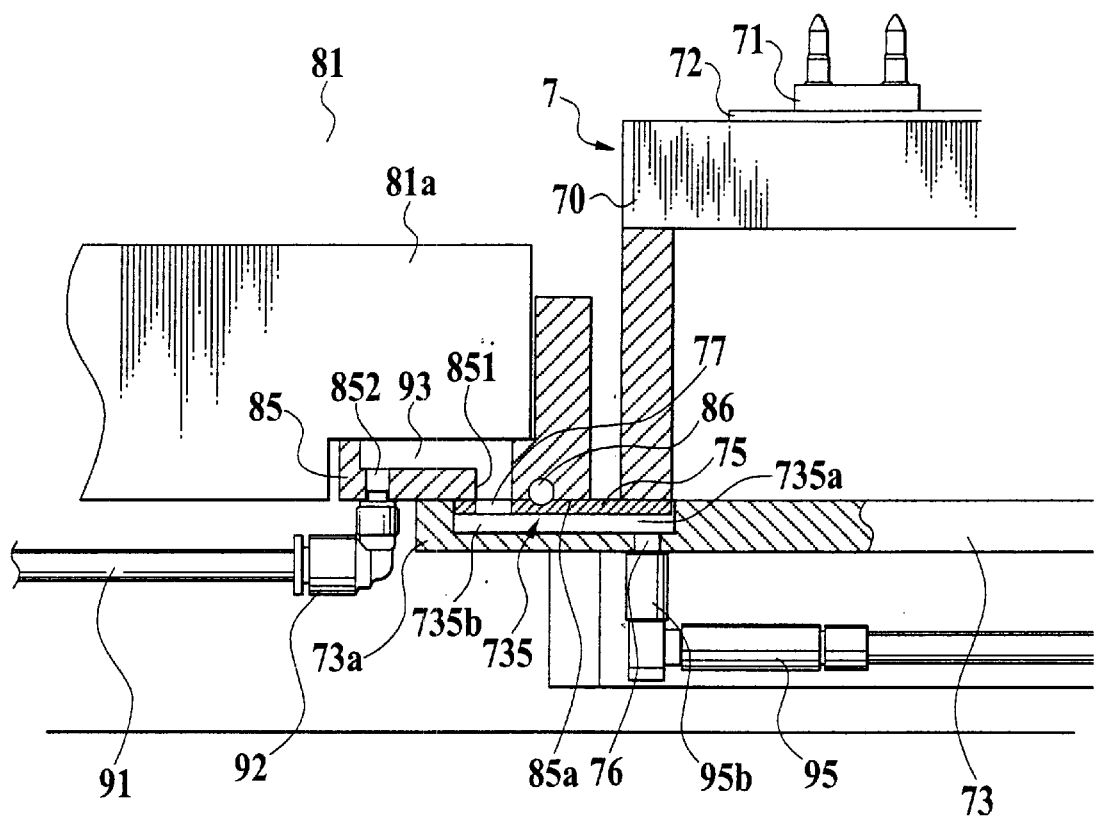

As shown in FIG. 2A, on an upper surface of the edge portion 73a of the base board portion 73, the grooved portion 735 opening toward upward is formed. On a bottom surface of an end portion 735a (an inside of the base board portion 73) of the grooved 735 near the box body portion 70, the hole portion 76 is formed through the base board portion 73 and connected to an edge portion 95b of the box lower piping portion 95 at the bottom of the base board portion 73.

Figure 2B:
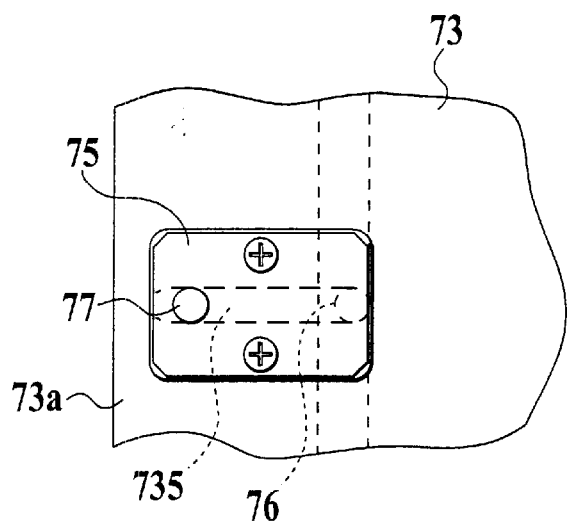
Figure 3:
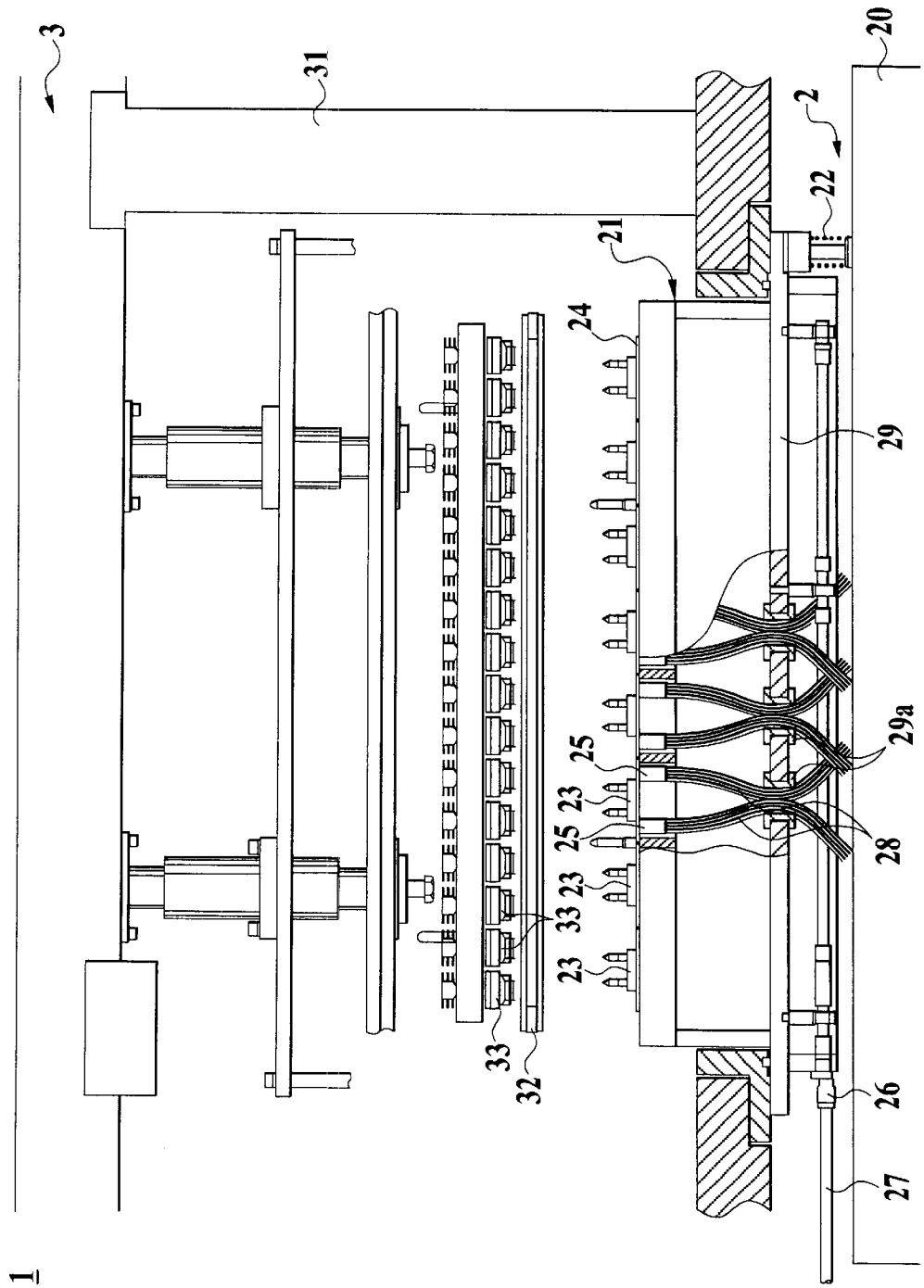
FIG. 3 is a vertical section in which a portion is partially interrupted, showing a connecting mechanism between the test head and the automatic handler according to the earlier technology.
Figure 4A:
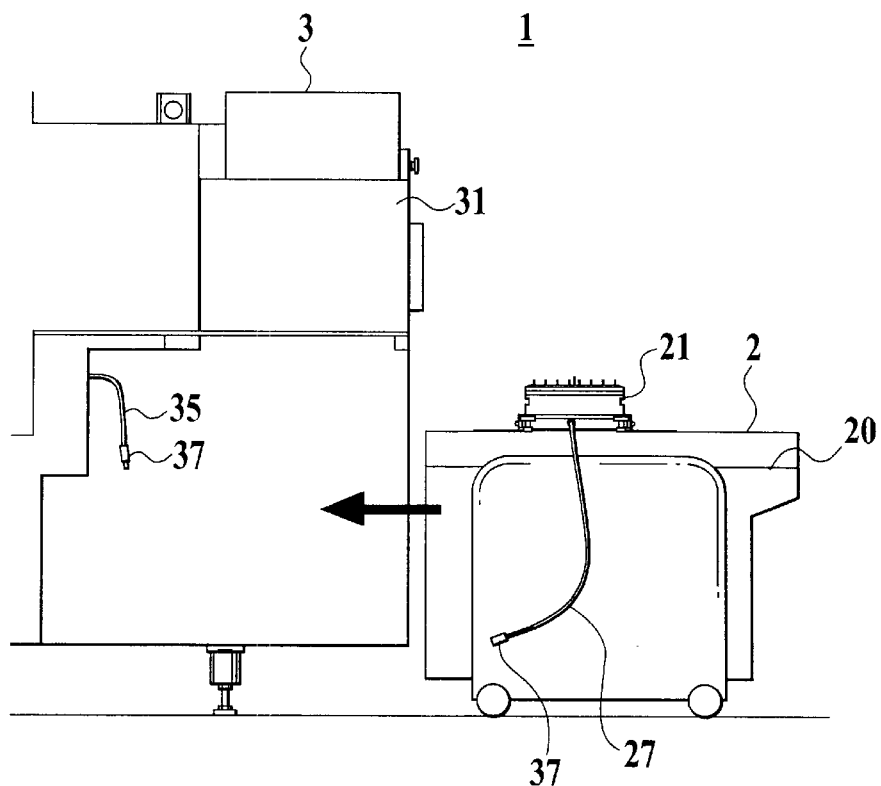
FIGS. 4A and 4B are views showing operations for connecting the test head to the automatic handler of FIG. 3 in an IC testing apparatus.
Figure 4B:
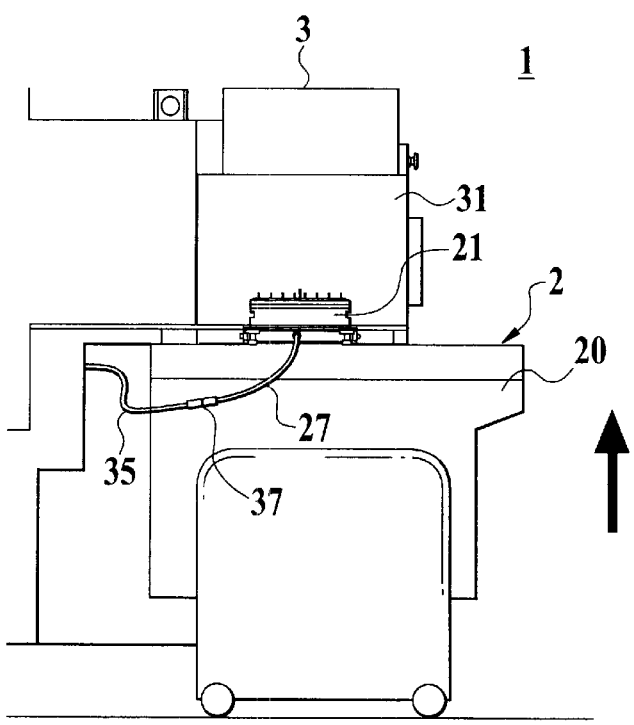

As shown in FIG. 2B, a plate 75 is attached to the base board portion 73 by screws over the grooved portion 735. The plate 75 is provided with the connection hole 77 above an outward end portion 735b of the grooved portion 735.

The connection hole 77 connects or leads to a lead hole (a first piping connection opening) 851 of the contact block 85 when the edge portion 73a of the base board portion 73 is brought into contact with the lower surface 85a of the contact block 85.

The plate 75 is fitted in a cutout portion formed in the upper surface of the base board portion 73 and on an upper edge portion of the grooved portion 735. The upper surface of the base board portion 73 is approximately flush or even with an upper surface of the plate 75. The plate 75 receives a packing 86 described in a later.

The automatic handler 8 has the thermostat 81 of which atmosphere is held at a constant temperature with cooled air which is cooled by liquefied nitrogen and circulated in the thermostat 81 by a fan. The automatic handler 8 has a transfer carrier 82 for holding and transferring the ICs under test in the thermostat 81, and a contact pusher 83 for pressing the ICs under test in the transfer carrier 82 against the test head 6 and then for bringing the ICs under test into contact with the IC sockets 71 of the test head 6. The automatic handler 8 also has an automatic handler piping portion (a first piping portion) 9, which is connected to the dry air supply unit 89 and leads the dry air from the dry air supply unit 89.

The ICs under test are transferred from a loader, which is not shown, of the automatic handler 8 to the transfer carrier 82. The dry air supply unit 89 sends the dry air to the testing box 7, preventing the outside air from entering the testing box 7 in the thermostat 81 to prevent the frost formation in the testing box 7 when the electric characteristics of the ICs under test are tested in the thermostat 81 held at a low temperature.

On the bottom of the thermostat 81, an opening portion 811 through which the testing box 7 is inserted is formed. The contact block 85 is disposed along a lower surface and inner side surface of a side wall of a bottom board edge portion 81a constituting an edge portion of the opening portion 811. The contact block 85 has the packing 86 on the lower surface 85a, preventing moisture of the outside air from entering. The lower surface 85a is in contact with the upper surface of the edge portion 73a of the base board portion 73 of the testing box 7 of the test head 6.

In the thermostat 81, the testing box body portion 70 of the testing box 7 of the test head 6 is inserted from the opening portion 811, and then the tests of the ICs under test are carried out. That is, leads of the ICs under test held in the transfer carrier 82 in the thermostat 81 are pressed against and brought into contact with contacts of the IC sockets 71 on the upper surface of the testing box body 70 by the contact pusher 83. Then the ICs under test are connected to the IC sockets 71 and the electric characteristics of the ICs under test are tested.

The piping portion 9 of the automatic handler 8 is provided with a straight piping portion 91 connected to the dry air supply unit 89 at one end, and an elbow 92 connected to the other end of the straight piping portion 91. The automatic handler 8 includes the dry air supply unit 89. The piping portion 9 is constituted of the straight piping portion 91, the elbow 92 and a lead portion 93 formed in the contact block 85.

The lead portion 93 has a groove-like shape and is formed in the upper surface of the contact block 85. The upper surface of the contact block 85 is brought into contact with the lower surface of the bottom board edge portion 81a of the thermostat 81. The lead portion 93 is provided with the lead hole 851 leading to the outside, and an air intake 852 leading to the lead hole 851 at a side of the opening portion 811. The air intake 852 is connected to the elbow 92 through which the dry air transferred from the straight piping portion 91 is sent to the outside through the lead hole 851. The lead hole 851 leads or connects to the connection hole 77 when the test head 6 is connected to the automatic handler 8. The dry air sent from the straight piping portion 91 through the elbow 92 is sent to lead portion 93, and then to the connection hole 77 through the lead hole 851.

Next, the operations of the mechanism for connecting the test head to the automatic (low temperature) handler according to the embodiment will be explained.

The test head 6 is connected to the automatic handler 8. That is, the test head 6 is positioned at a predetermined position under the thermostat 81 of the automatic handler 8, and then the testing box 7 of the test head body 60 is raised and inserted in the thermostat 81 from the opening portion 811.

At this time, the edge portion 73a of the base board portion 73 of the testing box 7 is brought into contact with the lower surface 85a of the contact block 85 disposed on the bottom board edge portion 81a of the thermostat 81. At the same time, the lead hole 851 of the contact block 85 and the connection hole 77 through the plate 75 attached to the base board portion 73 are connected to each other, then the piping portion 9 of the automatic handler 8 and the piping portion 10 of the test head 6 are connected to each other. The packing 86 is disposed on a joint between the automatic handler 8 and the test head 6, preventing the entering of the outside air in the thermostat 81 from the outside through interfaces between the automatic handler 8 and the test head 6, that is, between the bottom board edge portion 81a of the thermostat 81 and the base board portion 73.

The dry air supplied from the dry air supply unit 89 passes through the piping portion 9 and piping portion 10, and then reaches to the inside of the testing box 7. That is, the dry air passes through straight piping portion 91, the elbow 92, the air intake 852, the lead portion 93, the lead hole 851 of the piping portion 9, and the connection hole 77 of the piping portion 10. Then, the dry air passes through the grooved portion 735, the hole portion 76, the box lower piping portion 95, the vent holes 733, and then reaches in the testing box 7.

As described above, the dry air from the dry air supply unit 89 can be supplied to the testing box 7 only by the connection of test head 6 and the automatic handler 8. Thus, the operations of connection for supplying the dry air to the testing box 7, such as the connection of piping hoses, are not required, differing from the earlier technology. Accordingly, the trouble of the setting operations for testing of the ICs under test with the IC test system 5 can be saved, resulting in a smooth setting without forgetting the connection between the piping of the automatic handler and the piping of the test head for supplying of the dry air, differing from the earlier technology.

When the test head 6 is separated from the automatic handler 8, only the operations for the separation of the test head 6 are required, and the operations for the separation of the piping hoses for supplying the dry air are not required, differing from the earlier technology. Thus, the piping may not become wrong or be damaged by forgetting the operations for the separation of the connected piping when the test head 6 is separated from the automatic handler 8.

Furthermore, the piping of the automatic handler or the piping of the test head does not interfere with the transfer of the test head 6 when the test head 6 is connected to the automatic handler 8 or when the test head 6 is separated from the automatic handler 8, differing from the earlier technology. Thus, the test head 6 can be easily connected to the automatic handler 8, and separated from the automatic handler 8.

From the foregoing description, one skilled in the art can easily ascertain the essential characteristics of this invention, and without departing from the spirit and scope thereof, can make various changes and modifications of the invention to adapt it to various usage and conditions.

The entire disclosure of Japanese Patent Application No. 2000-54014 filed on Feb. 29, 2000 including specification, claims, drawings and summary are incorporated herein by reference in its entirety.

What is claimed is:

1. A mechanism for connecting a test head to an automatic handler, comprising:
   a first contacting member for contacting with the test head, the first contacting member being provided in the automatic handler;
   a first piping portion provided on the first contacting member;
   a second contacting member for contacting with the first contacting member in the automatic handler, the second contacting member being provided in the test head;
   a second piping portion provided on the second contacting member; and
   a fluid supply means for keeping a testing environment for an IC under test by supplying fluid for preventing a frost formation in the test head through the first piping portion and the second piping portion;
   wherein the first piping portion is connected to the second piping portion by contacting the first contacting member with the second contacting member when a testing portion of the test head is inserted into the automatic handler.

2. The mechanism for connecting a test head to an automatic handler as claimed in claim 1, wherein the automatic handler comprises a thermostat,
   the test head comprises a testing box which is inserted in the thermostat, the testing box is provided with an IC socket which is brought into electrical contact with the IC under test, and
   when the testing box is inserted in the thermostat, a first piping connection opening of the automatic handler and a second piping connection opening of the test head are connected to each other in a contacting portion between the thermostat and the testing box.

3. The mechanism for connecting a test head to an automatic handler as claimed in claim 1, wherein the fluid which is supplied to the test head from the fluid supply means comprises dry air.

4. The mechanism for connecting a test head to an automatic handler as claimed in claim 1, wherein the automatic handler is of a horizontal conveyer type and has a function for keeping a low temperature, and frost formation in the test head connected to the automatic handler is prevented.

5. The mechanism for connecting a test head to an automatic handler as claimed in claim 1, wherein a first piping connection opening is formed in a block disposed on a thermostat of the automatic handler, and a second piping connection opening is formed in a base board of the test head.

6. The mechanism for connecting a test head to an automatic handler as claimed in claim 1, wherein the test head for testing the IC under test comprises a testing box having an IC socket which is brought into electrical contact with the IC under test, a first piping connection opening is integrally formed in a thermostat of the automatic handler, and a second piping connection opening is integrally formed in a base board of the test head.

7. A mechanism for connecting a test head to an automatic handler, comprising:
   a first contacting member for contacting with the test head, the first contacting member being provided in the automatic handler;
   a first piping portion provided on the first contacting member;
   a second contacting member for contacting with the first contacting member in the automatic handler, the second contacting member being provided in the test head; and
   a second piping portion provided on the second contacting member;
   wherein the first piping portion is connected to the second piping portion by contacting the first contacting member with the second contacting member when a testing portion of the test head is inserted into the automatic handler.

8. An IC test device comprising an automatic handler and a test head,
   the automatic handler having a first contacting member for contacting with the test head, the first contacting member having a first piping portion;
   the test head having a testing portion and a second contacting member for contacting with the first contacting member, the second contacting member having a second piping portion;
   wherein the first piping portion is connected to the second piping portion by contacting the first contacting member with the second contacting member when the testing portion of the test head is inserted into the automatic handler.

9. The IC test device as claimed in claim 8, wherein the first contacting member further comprises a first connecting opening for being connected to the first piping portion, and the second contacting member further comprises a second connecting opening for being connected to the second piping portion; and wherein the first piping portion is connected to the second piping portion by connecting the first connecting opening to the second connecting opening.

10. The IC test device as claimed in claim 9, wherein the second contacting member further comprises a grooved portion for connecting the second connecting opening to the second piping portion.

11. An automatic handler comprising:

a contacting member for contacting with a test head; and a piping portion provided on the contacting member; wherein the piping portion is connected to a piping of the test head by contacting the contacting member with the test head with a testing portion of the test head is inserted into the automatic handler.

12. A test head comprising:

a testing portion;

a contacting member for contacting with an automatic handler; and a piping portion provided on the contacting member;

wherein the piping portion is connected to a piping of the automatic handler by contacting the contacting member with the automatic handler when the testing portion is inserted into the automatic handler.

* * * * *